(12) United States Patent
Schmid et al.

(10) Patent No.: US 12,069,842 B2
(45) Date of Patent: Aug. 20, 2024

(54) COOLING DEVICE FOR A POWER ELECTRONICS MODULE WITH COOLING ADAPTER, POWER ELECTRONICS MODULE AND MOTOR VEHICLE

(71) Applicant: Bayerische Motoren Werke Aktiengesellschaft, Munich (DE)

(72) Inventors: Ludwig Schmid, Munich (DE); Peter Schreivogel, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 212 days.

(21) Appl. No.: 17/741,014

(22) Filed: May 10, 2022

(65) Prior Publication Data

US 2022/0369495 A1 Nov. 17, 2022

(30) Foreign Application Priority Data

May 12, 2021 (DE) ...................... 10 2021 112 409.3

(51) Int. Cl.
*H05K 7/20* (2006.01)

(52) U.S. Cl.
CPC .......... *H05K 7/209* (2013.01); *H05K 7/2049* (2013.01); *H05K 7/20445* (2013.01); *H05K 7/20454* (2013.01)

(58) Field of Classification Search
CPC .......... H05K 7/20445; H05K 7/20454; H05K 7/2049; H05K 7/209; H01L 23/34–4735
See application file for complete search history.

(56) References Cited

U.S. PATENT DOCUMENTS

| | | | |
|---|---|---|---|
| 6,317,322 B1 | 11/2001 | Ueki et al. | |
| 2006/0221576 A1* | 10/2006 | Takano | H01L 23/4006 257/E23.084 |
| 2009/0139690 A1 | 6/2009 | Maerz et al. | |
| 2019/0043779 A1* | 2/2019 | Chung | H05K 1/0203 |
| 2019/0052186 A1* | 2/2019 | Hayashi | H02M 7/48 |
| 2019/0132938 A1 | 5/2019 | Mira et al. | |
| 2020/0328179 A1 | 10/2020 | Lemke et al. | |

FOREIGN PATENT DOCUMENTS

| | | | |
|---|---|---|---|
| DE | 10142975 A1 * | 4/2003 | ......... H01L 21/4882 |
| DE | 10 2007 057 533 B4 | 7/2016 | |
| DE | 10 2019 205 411 A1 | 10/2020 | |
| JP | 2007243051 A * | 9/2007 | |

OTHER PUBLICATIONS

German-language Search Report issued in German Application No. 10 2021 112 409.3 dated Jul. 2, 2021 with partial English translation (11 pages).

* cited by examiner

*Primary Examiner* — Zachary Pape
(74) *Attorney, Agent, or Firm* — Crowell & Moring LLP

(57) ABSTRACT

A cooling device for a power electronics module for cooling a power electronic assembly of the power electronics module includes a heatsink for dissipating waste heat from at least one power electronic component arranged on a circuit board, and at least one heat-conducting element for providing a local heat-conducting path between the at least one power electronic component and the heatsink. Heat-conducting element is formed as a cooling adapter and is separate from the heatsink and has a heat-conducting core, which can be arranged between the heat sink and the power electronic assembly and is designed to bridge a distance between the at least one power electronic component and the heatsink.

17 Claims, 3 Drawing Sheets

COOLING DEVICE FOR A POWER ELECTRONICS MODULE WITH COOLING ADAPTER, POWER ELECTRONICS MODULE AND MOTOR VEHICLE

CROSS REFERENCE TO RELATED APPLICATION

This application claims priority under 35 U.S.C. § 119 from German Patent Application No. DE 10 2021 112 409.3, filed May 12, 2021, the entire disclosure of which is herein expressly incorporated by reference.

BACKGROUND AND SUMMARY

The invention relates to a cooling device for a power electronics module for cooling a power electronic assembly of the power electronics module. The cooling device has a heatsink for dissipating waste heat from at least one power electronic component arranged on a circuit board of the power electronic assembly. In addition, the cooling device has at least one heat-conducting element for providing a heat-conducting path between the at least one power electronic component and the heatsink. The invention additionally relates to a power electronics module and a motor vehicle.

In the present case, interest is directed to power electronics modules for electrified motor vehicles, therefore electric or hybrid vehicles. Such power electronics modules can be inverters, for example, and have a power electronic assembly with a plurality of power electronic components, for example semiconductor switches, which are arranged on a circuit board. During the operation of the power electronics module, a heat loss or waste heat is produced on the power electronic components, as a result of which the power electronics module can overheat. To cool the power electronic component, the circuit board can be arranged on a heatsink, for example by means of a carrier plate, so that a heat-conducting path from the power electronic component to the heatsink is formed via the circuit board and, if appropriate, the carrier plate. The resultant temperature gradient and therefore the cooling efficiency is characterized by the thermal conductivities of the material layers involved and the thermal contact resistances between these material layers. The achievable cooling efficiency limits an operating range of the power electronic components, for example a switching frequency of the power semiconductor switches, and/or miniaturization of the power electronic components.

DE 10 2007 057 533 B4 discloses a heatsink having a main body which is provided with structures to enlarge a heat-dissipating surface. The main body and the structures formed in one piece with the main body are formed from an electrically insulating material. In addition, the heatsink has a multiplicity of metallic molded parts, which are each insulated electrically from one another, each molded part having a fixing section for fixing to a heat source and a thermal transport section. Such heat sources can be, for example, electronic circuits or assemblies. At least the thermal transport section of each metallic molded part is connected mechanically to the main body. The metallic molded parts act as a heat spreader because of their high thermal conductivity and thus ensure large-area coupling of heat into the main body. Such a heatsink has the disadvantage that it must be produced specifically for the electronic assembly to be cooled, since positions of the molded parts on the main body must be matched to positions of the heat sources on the circuit board.

It is an object of the present invention to provide a solution with which power electronic components of a power electronics module can be cooled in a simple and efficient way.

According to the invention, this object is achieved by a cooling device, a power electronics module and a motor vehicle having the features according to the present disclosure. Advantageous embodiments of the invention are also the subject matter of the description and the figures.

The cooling device according to the invention for a power electronics module is used to cool a power electronic assembly of the power electronics module. The cooling device has a heatsink for dissipating waste heat from at least one power electronic component arranged on a circuit board of the power electronic assembly. In addition, the cooling device has at least one heat-conducting element for providing a heat-conducting path between the at least one power electronic component and the heatsink. The at least one heat-conducting element is formed as a cooling adapter that is separate from the heatsink and has a heat-conducting core. The cooling adapter can be arranged between the heatsink and the power electronic assembly and is designed to locally bridge the distance between the at least one power electronic component and the heatsink.

The invention additionally relates to a power electronics module having a power electronic assembly and at least one cooling device according to the invention. The power electronic assembly has a circuit board and at least one power electronic component, which is fixed to the circuit board. The at least one power electronic component can be formed, for example, as a power semiconductor switch in the form of a semiconductor chip. The at least one power electronic component is fixed to the circuit board or a printed circuit board, for example by means of chip bonding, and contacted electrically there.

The heatsink is provided to cool the at least one power electronic component, which, during the operation of the power electronics module, forms a heat source. The heatsink can be, for example, a cooling plate which has at least one cooling channel for conducting a coolant. The circuit board is in particular positioned relative to the heatsink and fixed to the latter in such a way that that side of the circuit board on which the at least one power electronic component which is to be cooled is arranged faces the heatsink. In addition, when the circuit board is fixed to the heatsink, an interspace is formed between the circuit board and the heatsink. The distance formed by this interspace is bridged locally by means of the at least one heat-conducting element, which additionally provides the heat-conducting path between the power electronic component and the heatsink. This means in particular that there are heat-conducting elements which adjoin positions of the power electronic components on the circuit board only in the regions of the interspace.

The heat-conducting element is a separate component in the form of the cooling adapter, which can be arranged at any desired positions of the heatsink. The cooling adapter is arranged in the interspace in such a way that the heat-conducting core is located between the heatsink and the at least one component, and thus can thermally couple the heatsink to the at least one power electronic component. The heat-conducting core is formed from a highly thermally conductive material, for example copper. The heat-conducting element is in particular not formed in one piece with the heatsink or integrated in a material of the heatsink. The cooling adapter can be pressed or clamped in between the heatsink and the circuit board. In addition, the cooling adapter can be fixed to the heatsink and the power electronic assembly, for example via a thermally conductive adhesive film.

By means of the cooling adapter, a specific, local use of a highly thermally conductive material can be made. It is therefore not necessary for the power electronic assembly to be attached to the heatsink over its entire area by a thermally conductive material, so that the cooling device is formed particularly cost-effectively.

In an embodiment, the cooling device has a carrier plate, which is fixed to the heatsink and which is designed to hold the circuit board of the power module on the heatsink, wherein the carrier plate has at least one through opening, arranged to align with the at least one power electronic component, into which the at least one cooling adapter is plugged. In particular, the carrier plate is formed from a material, the thermal conductivity of which is lower than a thermal conductivity of the heat-conducting core. The carrier plate can, for example, be screwed to the heatsink. The use of the carrier plate permits pre-assembly of the circuit board for the subsequent mounting on the heatsink.

A heat-conducting path between the circuit board and the heatsink, which would lead through the carrier plate while including the carrier plate material, is restricted by the thermal properties of the carrier plate material and the thickness of the carrier plate. Materials with good thermal properties are expensive. In order to form the cooling device particularly cost-effectively, the heat-conducting path is led through the carrier plate without including the carrier plate material. To this end, the through openings are introduced into the carrier plate, and the cooling adapters are arranged in the through openings. The heat-conducting path between the power electronic assembly and the heatsink is thus formed by the heat-conducting core of the cooling adapter, excluding the carrier plate material. As a result, the carrier plate can be fabricated from a cost-effective material, for example plastic or aluminum, which is not optimized with regard to its thermal properties. Furthermore, the cooling adapter is used to compensate for the tolerance between the carrier plate and the circuit board, which takes place close to the thermal source.

In an advantageous development of the invention, the heat-conducting core has a first surface, for example an upper side, for attachment to the power electronic assembly, for example directly to the at least one power electronic component, and a second surface, for example an underside, for attachment to the heatsink. Via the first surface, heat from the power electronic assembly is input into the heat-conducting core and, via the second surface, the heat from the heat-conducting core is output to the heatsink. The heat-conducting core can, for example, be formed in the shape of a cylinder and be produced by stamping. As a result of the large-area thermal contact between the power electronic component and the surface of the heat-conducting core, the cooling adapter is additionally used for the heat spreading at the location of the heat source. By means of this heat spreading, the waste heat can be led away efficiently.

Furthermore, the cooling adapter has a sheath, which in particular is formed from an electrically insulating material, at least partly surrounding a lateral surface of the heat-conducting core. The sheath is arranged between the heat-conducting core and the carrier plate and is designed to hold the cooling adapter on the carrier plate. The sheath can be formed, for example, from a plastic or a ceramic. The sheath extends along the heat-conducting path between the carrier plate and the heat-conducting core, the upper side and the underside being exposed to make contact with the power electronic assembly and the heatsink. For example, the heat-conducting core can be overmolded or press-connected to the sheath. By means of the electrically non-conductive material of the sheath, the heat-conducting core is a galvanically separated from the surroundings, for example the carrier plate. As a result, the electrochemical voltage series between the heat-conducting core and a surrounding material or the carrier plate is interrupted. The use of a non-coated copper heat-conducting core in an aluminum carrier plate becomes permanently possible as a result. In addition, the electrical insulation of the power semiconductors relative to the surroundings can be achieved. In addition, the heat-conducting core can also be coated in an electrically insulating manner, whereby double insulation can be produced by using suitable thermal interface materials.

It proves to be advantageous if the sheath has, at least in some sections, a collar projecting laterally from the heat-conducting core, which rests on the carrier plate to hold the cooling adapter on the carrier plate when the cooling adapter is plugged in. In the area of the collar, the cooling adapter thus has a diameter which is larger than a diameter of the through opening in the carrier plate. As a result, in the area of the collar, the cooling adapter rests on an area of the carrier plate that surrounds the through opening and is thus held there. Spring elements are preferably formed on the collar, which are designed to force the cooling adapter away from the carrier plate and, in the process, to press the heat-conducting core onto the at least one power electronic component. The spring elements can, for example, be formed as elastic collar areas bent in the direction of the carrier plate. The spring elements provide a pressing force for the cooling adapter onto the power electronic assembly. Thus, it is possible to form a robust thermal connection between the heat-conducting core and the component to be cooled.

In one embodiment of the invention, the sheath has positioning pins, which can be inserted into positioning openings in the circuit board to position the cooling adapter. By using the positioning pins, the positioning of the cooling adapter with respect to the heat source can be ensured. In particular, the positioning pins have connecting elements, for example snap-in hooks, for the mechanical connection to the circuit board. The snap-in hooks form a snap-in connection or clip connection, for example, with an edge of the positioning openings in the circuit board.

The invention also includes a motor vehicle having at least one power electronics module according to the invention. The motor vehicle is in particular an electrified motor vehicle in the form of a passenger car.

The embodiments presented with reference to the cooling device according to the invention and the advantages thereof apply in a corresponding way to the power electronics module according to the invention and to the motor vehicle according to the invention.

Further features of the invention can be gathered from the claims, the figures and the figure description. The features and feature combinations mentioned above in the description and the features and feature combinations mentioned below in the figure description and/or shown on their own in the figures can be used not only in the respectively specified combination but also in other combinations or on their own.

The invention will now be explained in more detail by using a preferred exemplary embodiment and with reference to the drawings.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
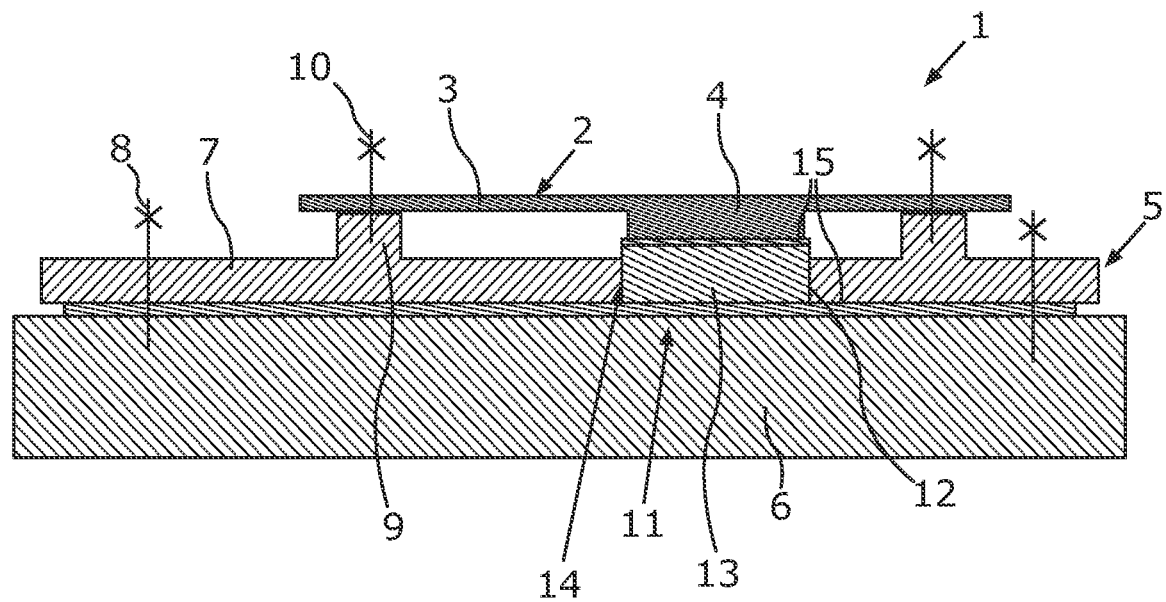
FIG. 1 shows a schematic sectional illustration of a first embodiment of a power electronics module.

In the figures, the same and functionally identical elements are provided with the same designations.

FIG. 1, FIG. 2, FIG. 3 and FIG. 5 show embodiments of a power electronics module 1 for an electrically driveable motor vehicle, not shown here. The power electronics module 1 has a power electronic assembly 2 having a circuit board 3 and at least one power electronic component 4. The at least one power electronic component 4 can be, for example, an SiC power semiconductor or a GaN power semiconductor. The power electronic component 4 forms a heat source, the heat from which is to be dissipated to avoid overheating. To this end, the power electronics module 1 has a cooling device 5 which, here, has a heatsink 6 and a carrier plate 7. The carrier plate 7 is formed, for example, from plastic or aluminum and is fixed to the heatsink 6, for example via screw connections 8. The carrier plate 7 permits simple mounting of the power electronic assembly 2 on the heatsink 6. To this end, the carrier plate 7 here has elevations 9, on which the circuit board 3 can be laid and to which the circuit board 3 can be fixed by means of screw connections 10. Here, the circuit board 3 is arranged on the carrier plate 7 in such a way that the power electronic component 4 faces the heatsink 6. As a result of fixing the circuit board 3 to the carrier plate 7, the power electronic component 4 is arranged at a distance from the heatsink 6.

For the thermal attachment of the heat source, that is to say the power electronic component 4, to the heatsink 6, the cooling device 5 additionally has a heat-conducting element 11. The heat-conducting element 11 is formed as a cooling adapter 12 that is separate from the heatsink 6. The cooling adapter can be brought to a thermal interface between the power electronic assembly 2 and the heatsink 6 in order to bridge the distance by forming a heat-conducting path between the power electronic component 4 and the heatsink 6. The cooling adapter 12 has a heat-conducting core 13 or an insert, for example of copper, and conducts the heat from the power electronic component 4 to the heatsink 6 without including the carrier plate 7 in the heat-conducting path.

To this end, a through opening 14, for example a hole, in which the cooling adapter 12 is arranged, is arranged in the carrier plate 7. As a result of the cooling adapter 12, the heat from the thermally loaded power electronic component 4 is spread to the heatsink 6. The cooling adapter 12 can be thermally coupled to the thermally loaded component 4 and to the heatsink 6 by the thinnest possible layer 15 of an interface material, for example a thermally conductive adhesive film, which results in a low thermal resistance. By using a heat-conducting core 13 with a high thermal conductivity, for example copper, the waste heat can be spread efficiently. Thus, the carrier plate 7 can be produced from more cost-effective materials with a lower thermal conductivity, for example aluminum or plastic.

Figure 2:
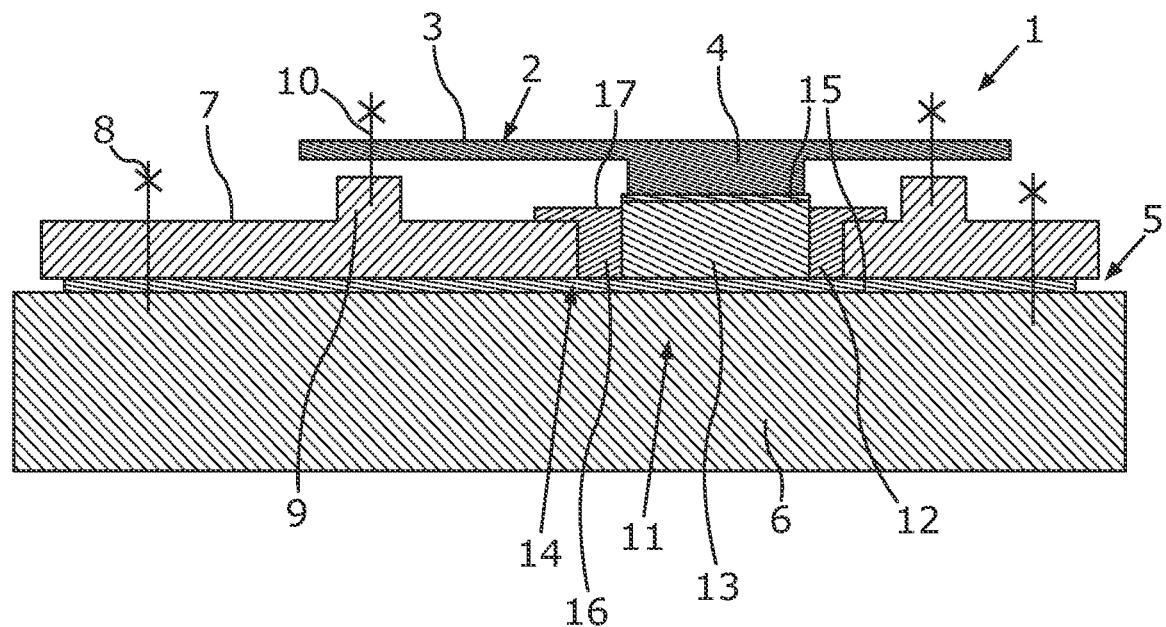
FIG. 2 shows a schematic sectional illustration of a second embodiment of a power electronics module.
Figure 3:
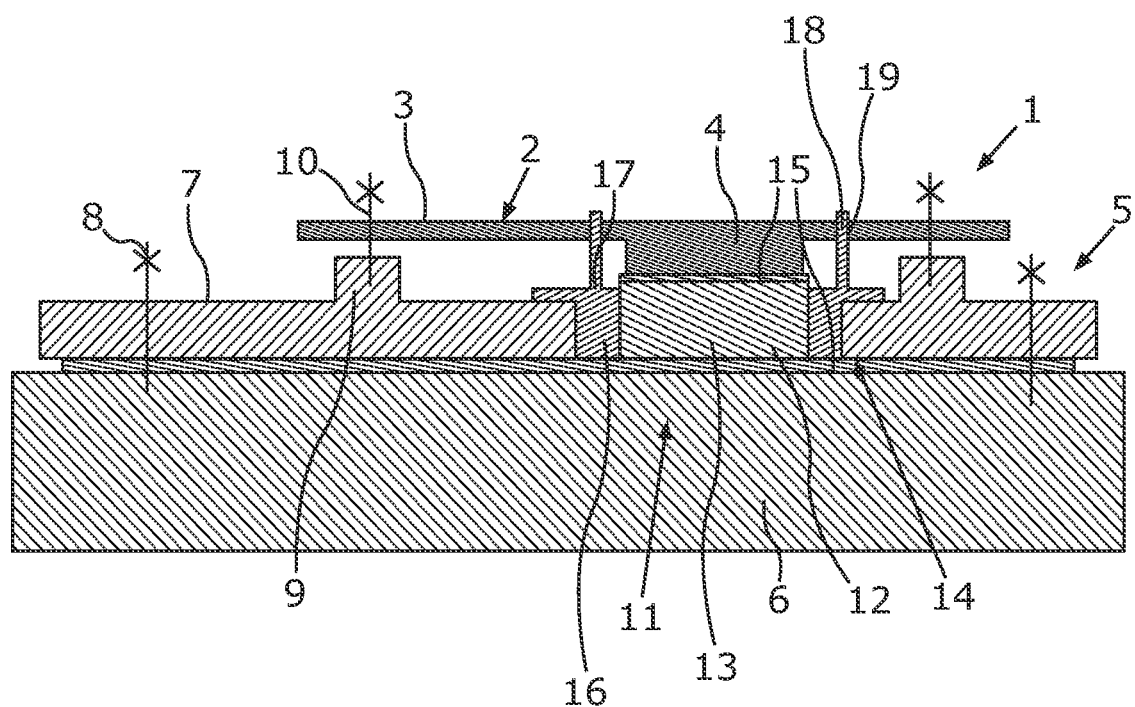
FIG. 3 shows a schematic sectional illustration of a third embodiment of a power electronics module.
Figure 5:
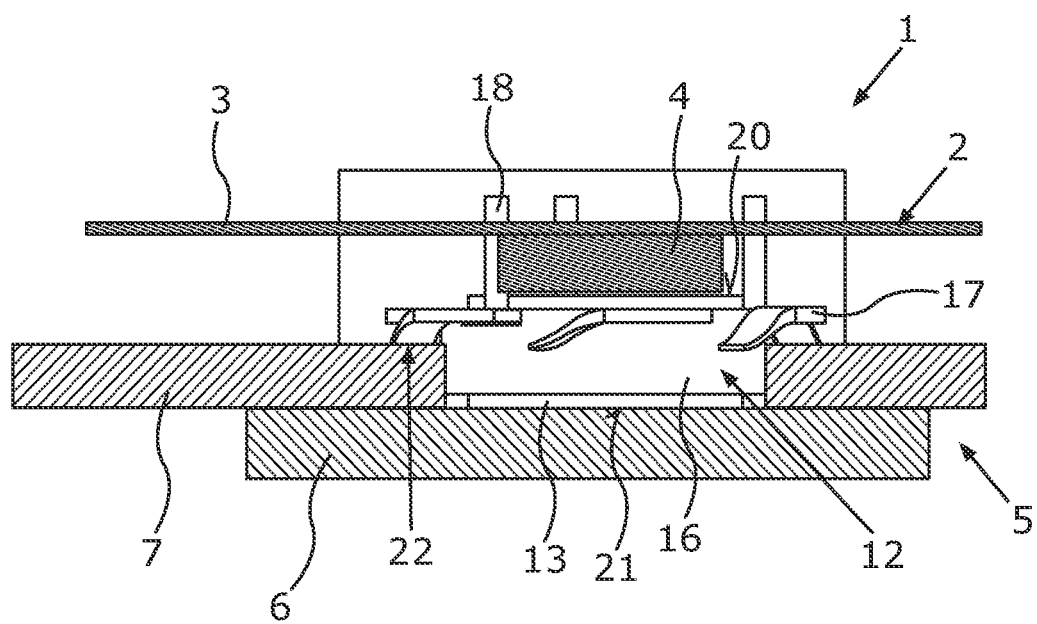
FIG. 5 shows a schematic sectional illustration of an embodiment of a power electronics module with the cooling adapter according to FIGS. 4a and 4b.

In the embodiment according to FIG. 2, FIG. 3 and FIG. 5, the cooling adapter 12 additionally has a sheath 16 partly surrounding the heat-conducting core 13. The sheath 16 can be produced from an electrically insulating material, for example a plastic or a ceramic. The sheath 16 has, at least in some sections, a collar 17, which rests on the carrier plate 7 and via which the cooling adapter 12 is held on the carrier plate 7. In the embodiment according to FIG. 3 and FIG. 5, the sheath 16 additionally has positioning pins 18, which can be inserted into positioning openings 19 in the circuit board 3. The positioning pins 18 can, for example, have snap-in hooks, which hook with an edge of the through opening 19 and thus fix the cooling adapter 12 to the circuit board 7.

Figure 4A:
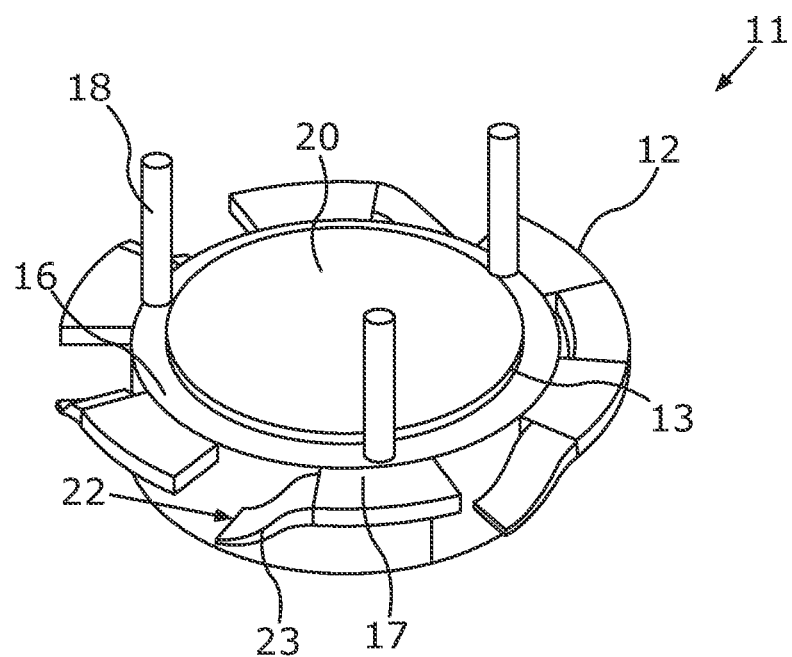
FIGS. 4a and 4b show different perspective illustrations of an embodiment of a cooling adapter.
Figure 4B:
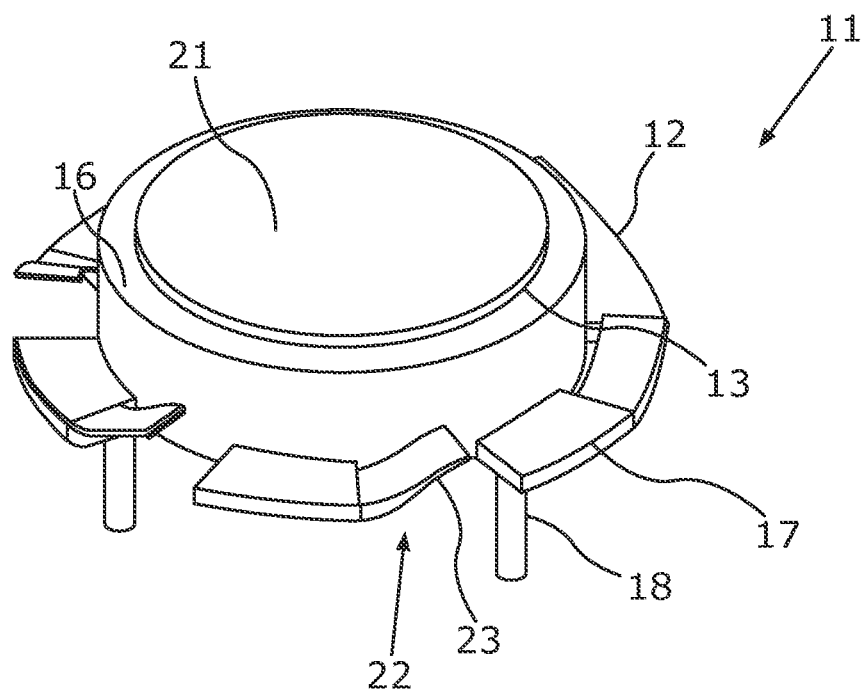

FIGS. 4a and 4b show schematic perspective illustrations of the cooling adapter 12. FIG. 4a shows a top view of the cooling adapter 12, a first surface 20 of the heat-conducting core 13 being an upper side, which is arranged on the power electronic assembly 2. FIG. 4b shows a bottom view of the cooling adapter 12, a second surface 21 of the heat-conducting core 13, opposite the first surface 20, being an underside, which is arranged on the heatsink 6. The heat-conducting core 13 is here formed to be cylindrical with circular surfaces 20, 21. The collar 17 which, here, is formed by a plurality of collar sections, has spring elements 22. Here, the spring elements 22 are formed as elastic, bent collar regions 23 of the collar sections 17. These spring elements 22 protrude at the through opening 14 in the carrier plate 7 and press the cooling adapter 12 away from the carrier plate 7, as shown in FIG. 5. As a result, the heat-conducting core 13 is pressed onto the power electronic assembly 2, in particular directly onto the power electronic component 4. The cooling adapter 12 thus also ensures compensation for tolerances close to the heat source.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A cooling device for a power electronics module for cooling a power electronic assembly of the power electronics module, the cooling device comprising:
   a heatsink configured to dissipate waste heat from at least one power electronic component arranged on a circuit board of the power electronic assembly; and
   at least one heat-conducting element configured to provide a heat-conducting path between the at least one power electronic component and the heatsink, wherein the at least one heat-conducting element comprises:
   a cooling adapter that is separate from the heatsink and has a heat-conducting core, which heat-conducting core is configured to be arranged between the heatsink and the power electronic assembly and to bridge a distance between the at least one power electronic component and the heatsink;
   a sheath at least partly surrounding a lateral surface of the heat-conducting core, the sheath comprising, at least in some sections, a collar projecting laterally from the heat-conducting core; and spring elements formed on the collar that are configured to force the cooling adapter away from a carrier plate and to press the heat-conducting core onto the power electronic assembly.

2. The cooling device according to claim 1, further comprising:
the carrier plate, wherein the carrier plate is fixed to the heatsink and is configured to hold the circuit board on the heatsink,
wherein the carrier plate comprises at least one through opening aligned with the at least one power electronic component, and
wherein the at least one cooling adapter is positioned within the at least one through opening.

3. The cooling device according to claim 2, wherein the carrier plate is formed from a material having a thermal conductivity lower than a thermal conductivity of the heat-conducting core.

4. The cooling device according to claim 3, wherein the heat-conducting core comprises:
a first surface configured to attach to the power electronic assembly; and
a second surface configured to attach to the heatsink; and
wherein the sheath is arranged between the heat-conducting core and the carrier plate and is configured to hold the cooling adapter in the at least one through opening of the carrier plate.

5. The cooling device according to claim 4, wherein the collar rests on the carrier plate to hold the cooling adapter on the carrier plate when the cooling adapter is positioned within the through opening.

6. The cooling device according to claim 5, wherein the sheath comprises positioning pins that are configured to be inserted into positioning openings in the circuit board to position the cooling adapter.

7. The cooling device according to claim 3, wherein the sheath comprises positioning pins that are configured to be inserted into positioning openings in the circuit board to position the cooling adapter.

8. The cooling device according to claim 4, wherein the sheath comprises positioning pins that are configured to be inserted into positioning openings in the circuit board to position the cooling adapter.

9. The cooling device according to claim 2, wherein the heat-conducting core comprises:
a first surface configured to attach to the power electronic assembly; and
a second surface configured to attach to the heatsink; and
wherein the sheath is arranged between the heat-conducting core and the carrier plate and is configured to hold the cooling adapter in the at least one through opening of the carrier plate.

10. The cooling device according to claim 9, wherein the collar rests on the carrier plate to hold the cooling adapter on the carrier plate when the cooling adapter is positioned within the through opening.

11. The cooling device according to claim 10, wherein the sheath comprises positioning pins that are configured to be inserted into positioning openings in the circuit board to position the cooling adapter.

12. The cooling device according to claim 2, wherein the sheath comprises positioning pins that are configured to be inserted into positioning openings in the circuit board to position the cooling adapter.

13. The cooling device according to claim 1, wherein the sheath comprises positioning pins that are configured to be inserted into positioning openings in the circuit board to position the cooling adapter.

14. The cooling device according to claim 13, wherein the positioning pins comprise connecting elements further comprising snap-in hooks configured to create a mechanical connection to the circuit board.

15. A power electronics module for a motor vehicle, the power electronics module comprising:
a power electronic assembly having at least one circuit board and at least one power electronic component arranged on the circuit board; and
the cooling device according to claim 1.

16. A motor vehicle comprising at least one power electronics module according to claim 15.

17. A cooling device for a power electronics module for cooling a power electronic assembly of the power electronics module, the cooling device comprising:
a heatsink configured to dissipate waste heat from at least one power electronic component arranged on a circuit board of the power electronic assembly; and
at least one heat-conducting element configured to provide a heat-conducting path between the at least one power electronic component and the heatsink, wherein the at least one heat-conducting element comprises:
a cooling adapter that is separate from the heatsink and has a heat-conducting core, which heat-conducting core is configured to be arranged between the heatsink and the power electronic assembly and to bridge a distance between the at least one power electronic component and the heatsink; and
a sheath at least partly surrounding a lateral surface of the heat-conducting core, wherein the sheath comprises positioning pins that are configured to be inserted into positioning openings in the circuit board to position the cooling adapter.

* * * * *